(12) United States Patent
Richardson et al.

(10) Patent No.: US 6,211,518 B1
(45) Date of Patent: *Apr. 3, 2001

(54) ELECTRON BEAM DOSE CONTROL FOR SCANNING ELECTRON MICROSCOPY AND CRITICAL DIMENSION MEASUREMENT INSTRUMENTS

(75) Inventors: Neil Richardson, Palo Alto; Farid Askary, Santa Clara; Stefano E. Concina, San Jose; Kevin M. Monahan, Cupertino; David L. Adler, San Jose, all of CA (US)

(73) Assignee: Kla-Tencor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/195,097

(22) Filed: Nov. 18, 1998

Related U.S. Application Data

(62) Division of application No. 08/784,749, filed on Jan. 16, 1997, now Pat. No. 5,869,833.

(51) Int. Cl.[7] .................................................... H01J 37/00
(52) U.S. Cl. ........................... 250/310; 250/251; 250/307
(58) Field of Search ................................... 250/310, 251, 250/492.2, 307

(56) References Cited

U.S. PATENT DOCUMENTS

| 4,578,279 | * | 3/1986 | Zingher | 250/251 |
|---|---|---|---|---|
| 4,842,679 | * | 6/1989 | Kudo et al. | 250/492.2 |
| 4,992,661 | * | 2/1991 | Tamura et al. | 250/310 |
| 5,055,696 | * | 10/1991 | Haraichi et al. | 250/492.2 |
| 5,869,833 | * | 2/1999 | Richardson et al. | 250/310 |

* cited by examiner

*Primary Examiner*—Kiet T. Nguyen
(74) *Attorney, Agent, or Firm*—Allston L. Jones

(57) ABSTRACT

A system and method for controlling electron exposure on image specimens by adjusting a raster scan area in-between scan frame cycles. A small, zoomed-in, scan area and the surrounding area are flooded with positive charge for a number of frame cycles between scan frames to reduce the voltage differential between the scan area and surrounding area, thereby reducing the positive charge buildup which tends to obscure small features in scanned images. The peak current into a pixel element on the specimen is reduced by scanning the beam with a line period that is very short compared to regular video. Frames of image data may further be acquired non-sequentially, in arbitrarily programmable patterns. Alternatively, an inert gas can be injected into the scanning electron microscope at the point where the electron beam impinges the specimen to neutralize a charge build-up on the specimen by the ionization of the inert gas by the electron beam.

21 Claims, 9 Drawing Sheets

ELECTRON BEAM DOSE CONTROL FOR SCANNING ELECTRON MICROSCOPY AND CRITICAL DIMENSION MEASUREMENT INSTRUMENTS

This is a divisional of application(s), Ser. No. 08/784,749, filed on Jan. 16, 1997 now U.S. Pat. No. 5,869,833.

FIELD OF THE INVENTION

The present invention relates generally to enhanced feature measurement in scanning electron microscopy, and more specifically to a system and methods for controlling electron exposure on image specimens in scanning electron metrology, particularly in the inspection of features of micro-circuits. It may also apply to critical dimension measurement in similar instruments.

BACKGROUND OF THE INVENTION

In scanning electron microscopy, a beam of electrons is scanned over a specimen, and the resulting electrons that are returned from the specimen surface are used to create an image of the specimen surface. In some systems, the beam is arbitrarily controllable to make multiple scan passes over specific areas or portions of areas at different sample frequencies to magnify the image of the surface.

On a specimen made of a substantially insulative material (e.g., a semiconductor material), performing multiple scans over the same small area may cause the specimen to accumulate an excess positive charge in that small area relative to the rest of the scanned area. That excess charge causes an image of that small area to appear dark, thus obscuring image features in that small area.

SUMMARY OF THE PRESENT INVENTION

One embodiment of the present invention is a system and method for imaging a specimen that acquires a charge when scanned with a scanning electron microscope comprising an electron source and apparatus for forming, accelerating, focusing, and scanning an electron beam across a portion of said specimen. That imaging being performed by raster scanning a selected small area of the specimen for a single frame cycle, and then raster scanning a substantially larger area of the specimen that includes the small area to brighten the image of the small area of said specimen by flooding the substantially larger area with electrons.

A second embodiment of the present invention is a system and method of a scanning electron microscope to image a specimen that acquires a charge when scanned with a scanning electron microscope by injecting an inert gas at the point where the electron beam impinges on the surface of the specimen. That inert gas being ionized by the electron beam and thus neutralizing the charge as it builds up on the specimen.

BRIEF DESCRIPTION OF THE DRAWINGS

The accompanying drawings, which are incorporated in and constitute a part of this specification, illustrate several embodiments of the present invention and, together with the description, serve to explain the principles of the present invention.

DETAILED DESCRIPTION OF THE PRESENT INVENTION

Reference will now be made in detail to the preferred embodiments of the present invention, examples of which are illustrated in the accompanying drawings.

Figure 1:
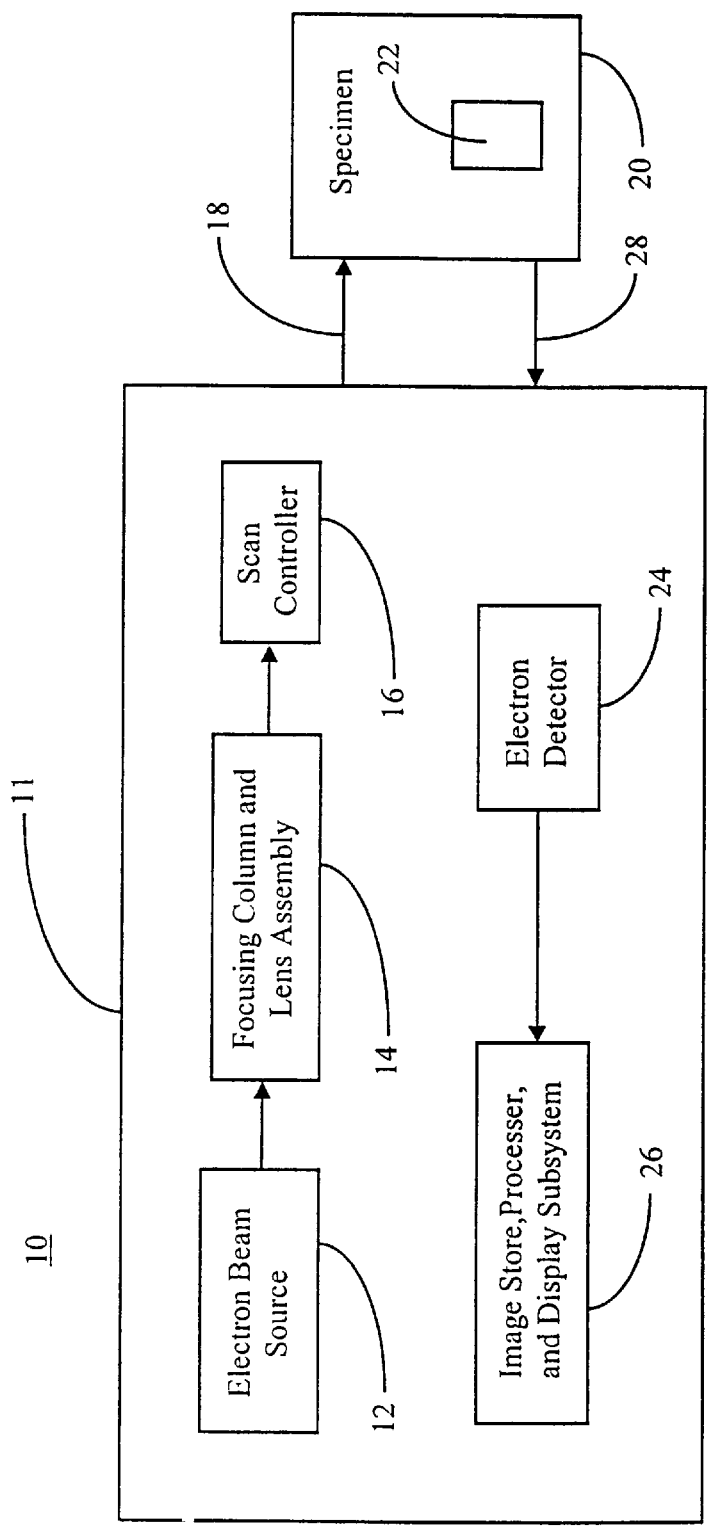
FIG. 1 is a simplified block diagram of the overall system of the present invention.

FIG. 1 shows a block diagram of system 10 including an electron microscope subsystem 11 of the present invention. The electron microscope subsystem 11 includes an electron beam source 12, a focusing column and lens assembly 14, and a scan controller 16 to scan an electron beam across selected regions of specimen 20. Also included in electron microscope system 11 is an electron detector 24 to detect secondary and backscattered electrons from specimen 20. In system 10 of the present invention, electron detector 24 is selected to have a bandwidth that is at least adequate to detect the secondary and backscattered electrons that form electron signal 28. For example, electron detector 24 may be a micro-channel plate, micro-sphere plate, semiconductor diode, or a scintillator/photomultiplier (PMT) assembly, each well known in the art. Then the electrons of signal 28 received by detector 24 are processed and stored for display by image processor and display subsystem 26.

In operation, electron beam 18 is scanned over specimen 20 and secondary and backscattered electron signal 28 is detected by electron detector 24. Further, electron beam 18 is focused on the surface of specimen 20 with the average current into specimen 20 determined by scan controller 16 that controls the raster scanning of beam 18. In the present invention electron beam 18, as discussed below, can be scanned for a single frame cycle, and then blanked for a period of one or more frame cycles.

Typically, specimen 20 may be comprised of a variety of materials with the present invention particularly applicable to materials containing a substantial amount of insulative material (e.g., semiconductor material). Small area 22 of specimen 20 is shown to illustrate a particular area of interest to be scanned to determine features of the specimen in the image of small area 22 developed by image processor and display subsystem 26. For example, small area 22, may, in a degenerate case, be a single line or a single pixel element on specimen 20. In the present invention the peak current onto small area 22 is reduced by scanning electron beam 18 faster than the television rate commonly used in conventional SEM instruments. In system 10 of the present invention, electron beam 18 is typically scanned with a line period of 16 μsec, or four times the rate normally used for TV raster scanning having a line period of 64 μsec.

Figure 2:
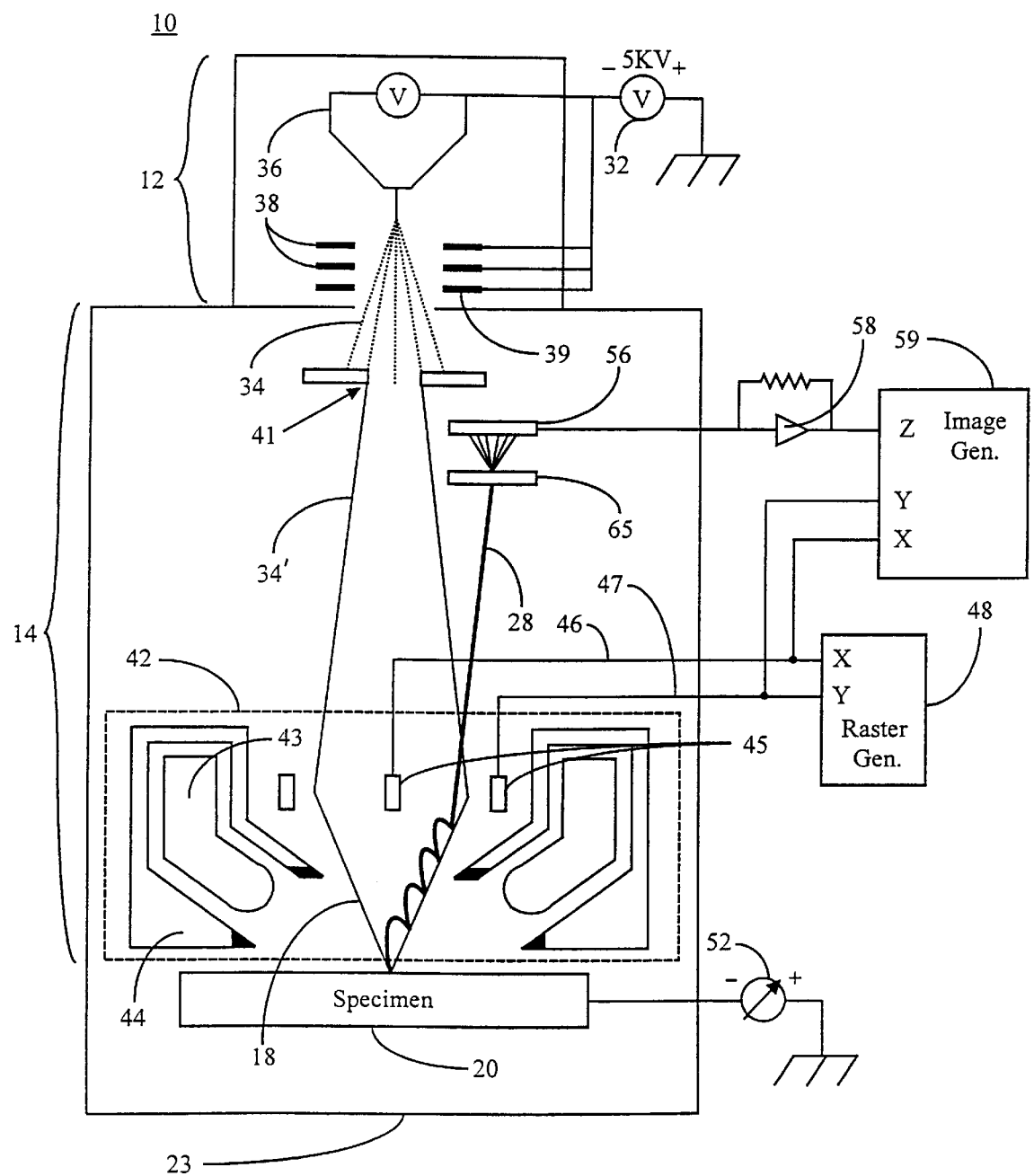
FIG. 2 a more detailed schematic of the system of the present invention shown in FIG. 1.

FIG. 2 shows a partial cross-sectional view of electron microscope subsystem 11 of the present invention to reveal more detail. As shown here, subsystem 11 is shown with electron beam source 12 at the top which produces electron beam 34. One implementation that could be used includes an electron gun 36 that consists of a thermal field emitter (TFE) with the electrons accelerated by a surface field generated by power supply 32. Alternative electron gun embodiments could be employed. The electrons emitted by electron gun 36 are then, within beam source 12, directed through electrodes 38 and gun lens 39 (each also controlled by power supply 32) to form electron beam 34 that enters focusing column and lens assembly 14 to be directed to specimen 20. It should also be noted that electrodes 38 typically include both suppressor and extractor electrodes.

In focusing column and lens assembly 14, electron beam 34 passes through an aperture 41, reducing the beam current from approximately 300 pA to a range of 5 to 100 pA forming what is labelled electron beam 34' in FIG. 2. A larger electron beam current (e.g., 100 pA) is particularly useful for pattern recognition. That larger beam current also reduces the integration time to achieve a given signal-to-noise ratio for the image or linescan which is well known in the art. Stated a little differently, there is a better signal-to-noise ratio for higher beam currents, however there is an improved image quality for lower beam currents.

Electron beam 34' then passes through objective lens 42, including magnetic coils 43 and pole pieces 44, that generate a strong magnetic field. That magnetic field is used to focus beam 34' to form electron beam 18 with a spot size of approximately 5 nm when directed at specimen 20. Additionally, the location of electron beam 18 is controlled with scan plates 45, located within the magnetic field created by coils 43 and pole pieces 44, with scan plates 45 powered by raster generator 48 to direct beam 18 in both the x and y directions across specimen 20 by signals on lines 46 and 47, respectively. To tie FIGS. 1 and 2 together in this area, scan plates 45 and raster generator 48 correspond to scan control 16 in FIG. 1.

Figure 3:
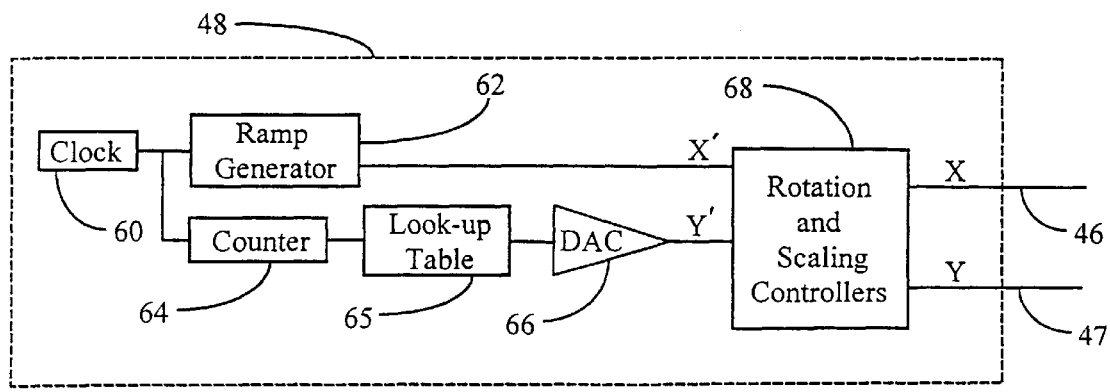
FIG. 3 is an expanded block diagram of the scanning control subsystem of FIG. 1.

Referring next to FIG. 3, there is shown a block diagram of one potential embodiment of raster generator 48. Included in this sample embodiment of raster generator 48 is a clock 60 to produce a timing signal that is applied to ramp generator 62 and counter 64. Ramp generator 62 in turn produces a ramp signal x', and counter 64 produces a digital signal which represents a preset count. The preset count from counter 64 being representative of the timing signal from clock 60. In turn, the preset count from counter 64 is applied to look-up table 65 wherein look-up table 65 has been programmed to select individual y-axis lines on the surface of specimen 20 to be scanned that corresponds to the count from counter 64. It should be noted here that the y-axis lines to be scanned may be sequential; non-sequential; selected lines with one or more intermediate lines skipped; selected lines scanned repeatedly; or any combination or order desired for various regions on the surface of specimen 20. The output digital value of look-up table 65 is then applied to digital-to-analog converter (DAC) 66 to produce a stepped signal, y', that corresponds to the y-axis position on specimen 20 to be scanned. Next, signals x' and y' are directed to the rotation and scaling controllers 68 (e.g., utilizing a multiplying D/A converter with a technique that is well known in the art) that produces signals x and y that are applied to scan plates 45 (see FIG. 2) via lines 46 and 47, respectively, to control the actual x and y positions electron beam 18 scans on specimen 20.

Figure 4A:
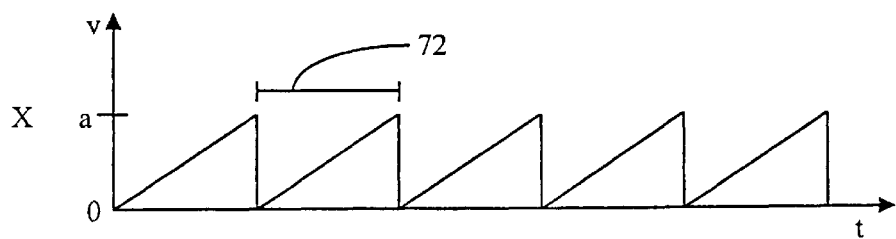
FIGS. 4a–4b show one possible set of scan system voltage control signal waveforms of FIG. 3.
Figure 4B:
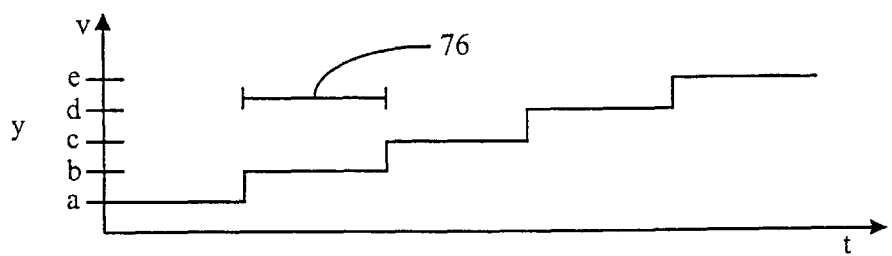
Figure 4C:
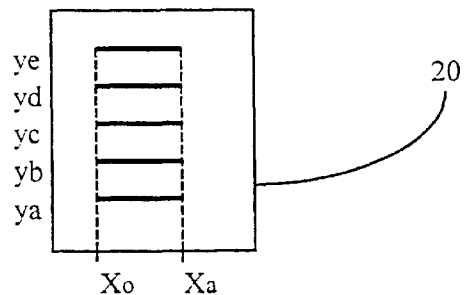
FIG. 4c illustrates the scan pattern on the substrate when the signal waveforms of FIGS. 4a–4b are used.

Referring next to FIGS. 4a and 4b, representative waveforms of signals x (46) and y (47), respectively, from raster generator 48 are shown. In FIG. 4a, ramp segment 72 in the x signal (46) directs beam 18, via scan plates 45, to scan a spot along a single line in the x-axis direction on specimen 20. Since each segment of the signal in FIG. 4a is the same magnitude in voltage, alternatively the same duration in time, the length of each corresponding scan in the x direction is of the same length. Concurrently, in FIG. 4b each step segment 76 of the y signal (47) provides a y-address of a different signal value in the y-axis direction that is traced in the x direction of specimen 20 by the x signal. To illustrate what the x and y signals of FIGS. 4a and 4b are actually causing to happen relative to specimen 20, FIG. 4c is provided to show the paths scanned based on those signals, i.e., each line starts at $x_0$ and proceeds to $x_a$ at each of the corresponding y coordinates starting with $y_a$ and progressing through $y_c$.

Figure 4D:
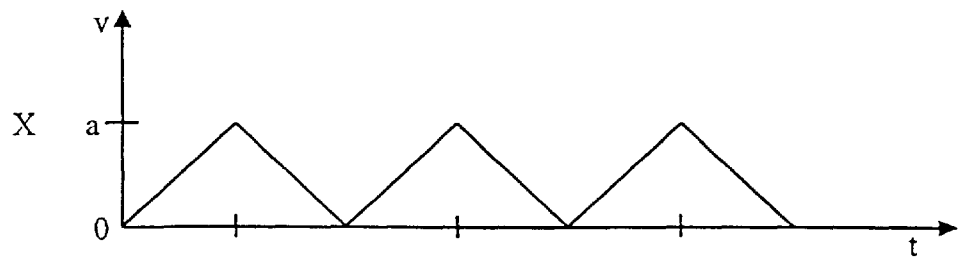
FIGS. 4d–4l illustrate similar scan system voltage control signal waveforms and scan patterns that may be used with the present invention.
Figure 4E:

However, scan signals x and y may be manipulated to vary the scan pattern in various ways. For example, in FIGS. 4d and 4e, each of lines $Y_a$, $Y_b$ and $Y_c$ on specimen 20 are each scanned twice along the x axis from $x_0$ to $x_a$ and then back from $x_a$ to $x_0$ before progressing to the next y line.

Figure 4F:
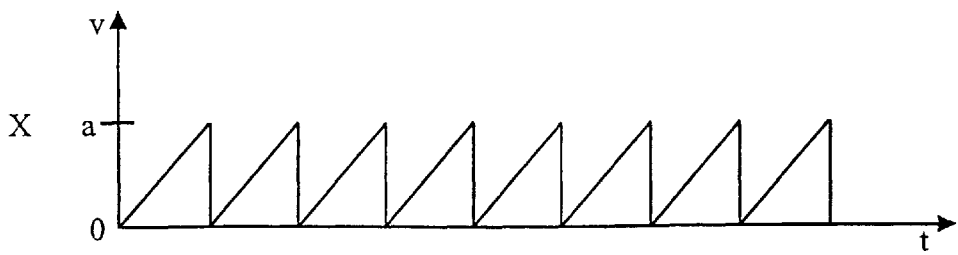
Figure 4G:
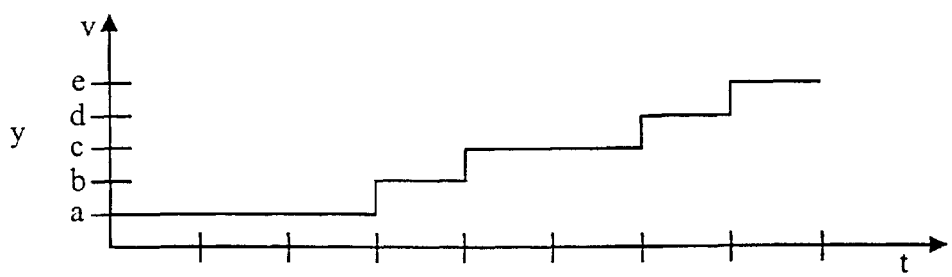

Another potential scan pattern is represented by FIGS. 4f and 4g where line $y_a$ is scanned three times in the x direction between $x_0$ and $x_a$, always in the same x direction; then line $Y_b$ is scanned once between $x_0$ and $x_a$; next line $y_c$ is scanned twice in the x direction between $x_0$ and $x_a$, always in the same x direction; and finally each of lines $y_d$ and $y_e$, in that sequence, are scanned once between $x_0$ and $x_a$.

Figure 4H:
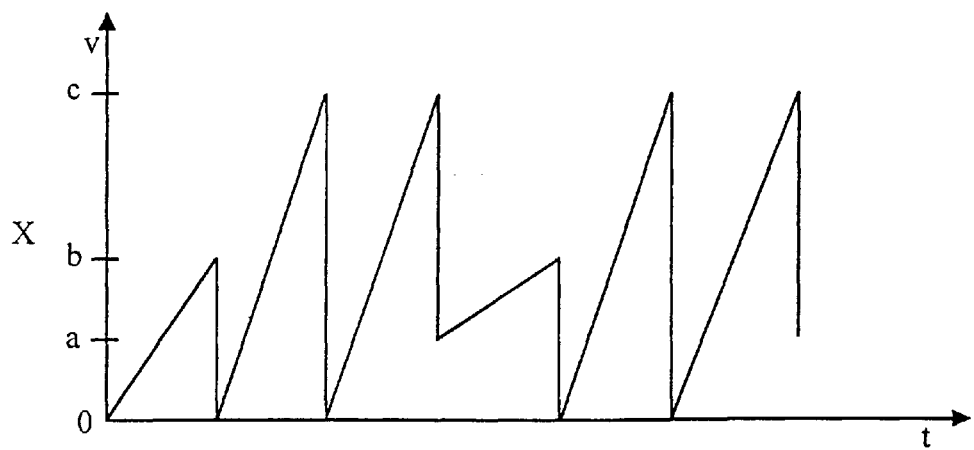
Figure 4I:
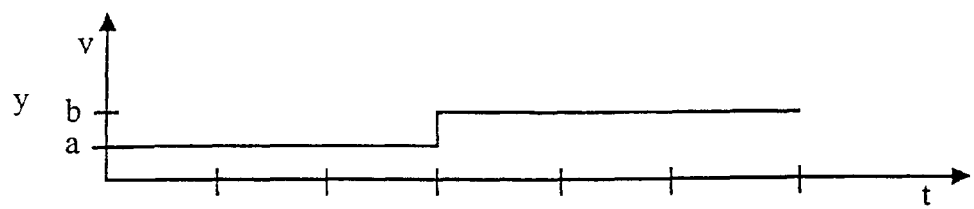
Figure 4J:
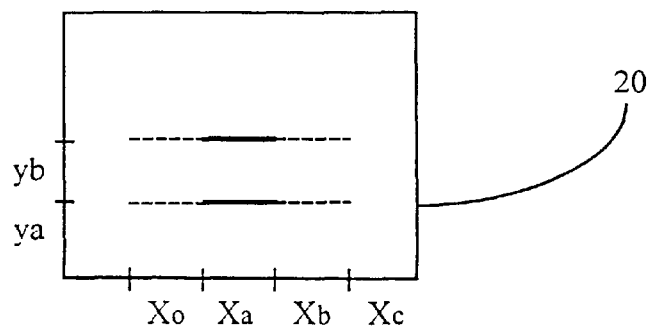

Yet another scan example is illustrated FIGS. 4h, 4i and 4j. Here two y lines, $y_a$ and $y_b$, are scanned in sequence with each y line scanned once between x coordinates $x_a$ and $x_b$, and then twice between the x coordinates $x_0$ and $x_c$.

Figure 4K:
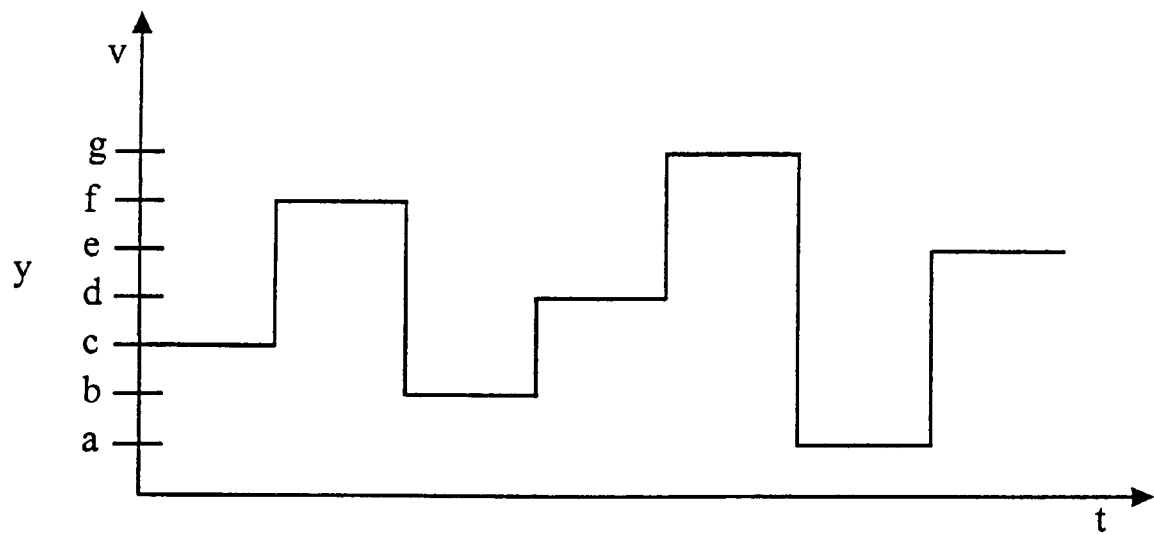
Figure 4L:
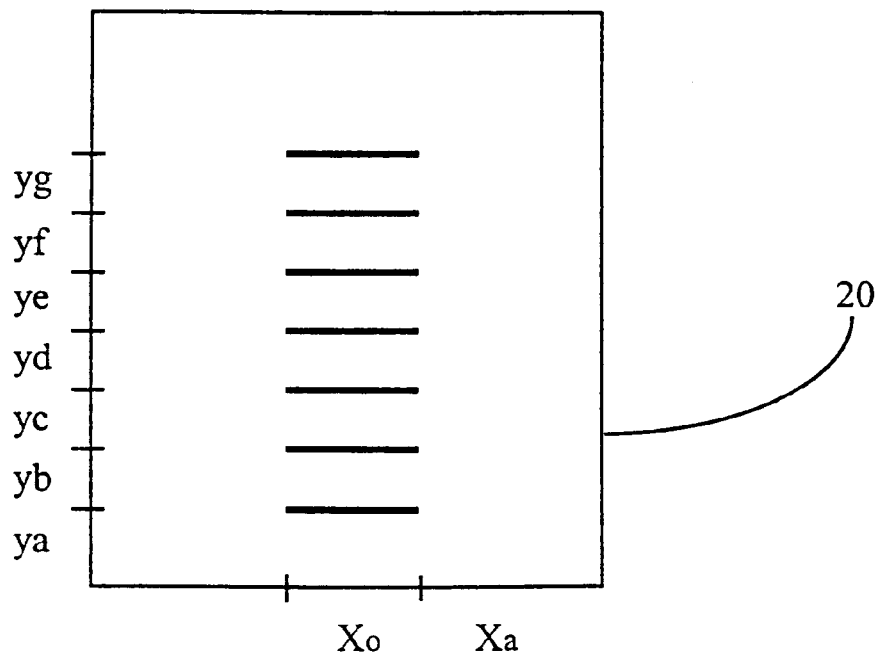

An additional example is illustrated in FIGS. 4k and 4l, assuming that the x axis scan is as illustrated in FIG. 4a. What is shown here is the non-sequential scanning of substrate 20 along a group of y lines, $y_a$ through $Y_g$, in the order of: $y_c$, $y_f$, $y_b$, $y_d$, $y_g$, $y_a$ and $y_c$.

It should be kept in mind that the various scan patterns illustrated here simply illustrate the variations in scan patterns that can be used and they are not intended to be anything other than examples of the variations of scan patterns that may be used.

Returning to FIG. 2, as beam 34' passes through the magnetic field of objective lens 42 and plates 45 it is focused into beam 18 and directed onto specimen 20. Given tolerances in today's applications, the spacing between column 14 (bottom of lens 42) and specimen 20 will typically be on the order of 2 mm, however that spacing is not critical to the operation of the present invention, it merely must be a known value. In addition, specimen 20 is biased to a selected potential by a second power supply 52 (e.g., up to 5 VDC) to create an extremely large decelerating field for the primary electrons of beam 18 as they approach specimen 20. The result is that the "landing energy" of those electrons as they reach specimen 20 is therefore much lower than the energy with which they are provided by electron gun 36 and with which they travel through column and lens assembly 14. The electron beam of the illustrated implementation starts out from electron gun 36 with an energy level of typically 5000 eV, and travels through column and lens assembly 14 with that energy level essentially unchanged. As electron beam 18 exits lens 42, the decelerating field radiating from specimen 20, created by the bias of second power supply 52, substantially decelerates the electrons within beam 18 to the desired landing energy.

The effect of reducing the landing energy of the electrons by controlling the decelerating field allows for excellent optical performance by reducing the chromatic aberration coefficient of objective lens 42, and provides some immunity from stray magnetic fields in the environment (e.g., stray fields of 50 or 60 cycles from power lines). Thus, the beam landing energy can be adjusted by adjusting the bias applied to specimen 20 from second power supply 52.

Continuing the discussion of the operation of the system illustrated in FIG. 2, secondary and backscatter electrons 28 are released as a result of the interaction of electron beam 18 with specimen 20 and are directed back toward lens 42. As electrons 28 are released, they spiral through lens 42 as a result of the magnetic field, and then travel toward detector 55 as they leave the field within lens 42. The electron signal received by detector 55 is then collected by collector plate 56 which in-turn generates a signal that is amplified by transimpedance amplifier 58 before being applied to image generator 59. Other input signals to image generator 59 are signals x and y from raster generator 48 on lines 46 and 47, respectively, to form a video signal representing an image of specimen 20, or selected portions thereof. Again correlating the relationship between FIGS. 1 and 2, electron detector 24 includes detector 55 and collector plate 56, while image subsystem 26 includes amplifier 58 and image generator 59. Additionally, electron beam source 12, focusing column and lens assembly 14, and specimen 20 are all contained within a vacuum chamber 23.

Note also that when a high electron beam current 18 is used, the integration time for detector 55 to achieve a given signal-to-noise ratio for an image or linescan is reduced. This shorter acquisition time allows faster pattern recognition in automated systems, and reduces sensitivity to low frequency vibration and electronic and electromagnetic noise in the system.

In a system as described herein it is useful to look at the ratio of the detected electron beam current 28 from specimen 20 to the incoming electron beam current 18 to specimen 20, with that ratio referred to as the "emission coefficient". There are several variables that affect the value of the emission coefficient, some of which are the specimen material, the topography of the sample area, the bias voltage on the specimen and the landing energy of the primary electron beam. In cases where the emission coefficient is greater than one (e.g., for silicon specimens)—that is, more electrons are being generated at the scanned area than are arriving at it—the specimen tends to build up a positive charge in the scanned area. For other materials the emission coefficient will have differing values, greater than, less than, or equal to, one when a positive charge builds on a specimen of that material. The field which decelerates the primary beam (i.e., resulting from the bias of second power supply 52) further tends to accelerate the electrons of beam 28 as they leave the specimen surface, which accentuates the depletion of electrons from specimen 20.

As mentioned previously, the electron microscope of the present invention is able to select small areas, including a single line, for raster scanning. Incoming electron beam 18 is further controllable so that any particular line or area on specimen 20 may be scanned several times. This creates a problem, however, in scanning situations where the emission coefficient is greater than one (e.g., for silicon specimens), or for whatever value for other materials that might constitute specimen 20. Attempting to zoom in on an image and measure very small areas results in the accumulation of a large positive charge in that area, and electrons are prevented from escaping from specimen 20 by the resulting electrostatic field. In the present invention, this problem is solved by flooding the surrounding area with electrons during a number of frame cycles as discussed below.

Figure 5:
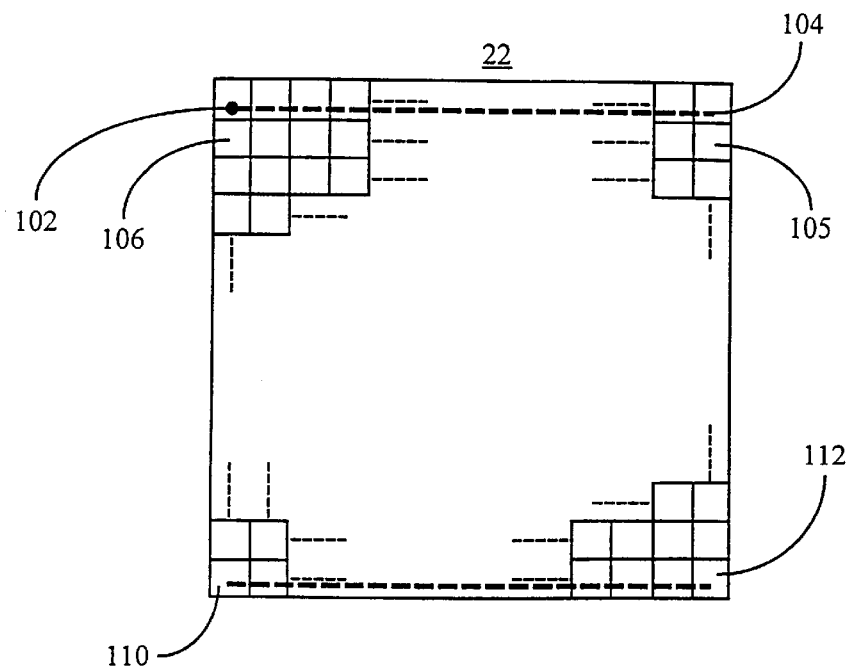
FIG. 5 shows a more detailed view of an image scan area and illustrates typical scan patterns.

As shown in FIG. 5, a small area 22 (see FIG. 1) may be scanned line by line. In the present invention that scan could begin with electron beam 18 at a top left pixel 102, proceed to the right across that y line in the increasing x direction to pixel 104, then proceed downward to a pixel 105 in another y line with the same x coordinate, from there proceed to the left in the negative x direction across that new y line to pixel 106, and continue scanning in that back and forth fashion in various y lines across small area 22. Then, when that scan reaches pixel 112, the beam is "blanked" (i.e., temporarily turned off) while electron beam 18 is returned to pixel 102. Alternatively, the scan may be controlled in one of the alternative patterns discussed in relation to FIGS. 4d–4l— what ever is appropriate for specimen 20.

On a specimen made up of a substantially insulative material (e.g., a semiconductor die), each scan may result in the release of secondary electrons, increasing the positive charge of the area of interest with each scan. As a result of repeated scans, small area 22 acquires a higher positive charge than the surrounding area of specimen 20. Such a positive charge will be displayed as a darkened area by image processor and display subsystem 26 in the resulting image. Depending on the level of positive charge on small area 22 relative to the surrounding area, features of small area 22 may be difficult to discern in that image.

Figure 6:
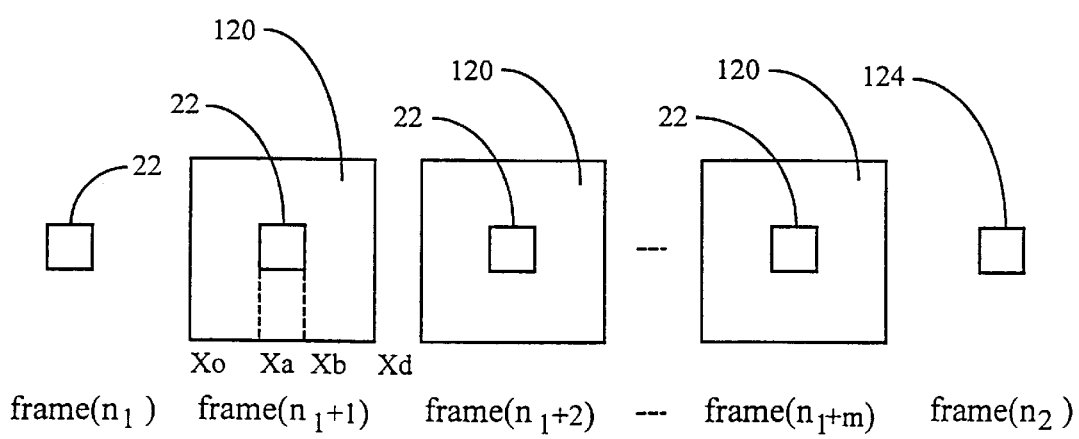
FIG. 6 shows a sequence of raster scans to illustrate the charge flooding technique of one embodiment of the present invention.

As shown in FIG. 6, the technique of one embodiment of the present invention alleviates that darkened image problem by performing a sequence of scans which includes flooding an image area 120 (includes small area 22 and the area surrounding small area 22) during an integer number of raster scans. For example, in a first scan frame cycle, $n_1$, each line of only small area 22 is scanned. In each of a selected number of subsequent frames $n_1+1, n_1+2, \ldots, n_1+m$, each line in all of image area 120 is scanned in each frame sequentially, each time scanning the significantly increased image area of image area 120 as compared to small area 22, thus essentially flooding the image area 120. The next small area 124 on specimen 20 (may be the same, overlapping, adjoining, or separated from, small area 22) and the surrounding larger image area is similarly scanned in frame $n_2$. This process is thus repeated until all of the small areas 22, 124, . . . , of interest are scanned. It must also be kept in mind that each subsequent small area to be imaged may be the same as the previously scanned small area, or offset from that previously scanned small area. Also during scanning of subsequent small areas (e.g., small area 124), the image area (e.g., 120') to be flooded, may include a substantial portion of the image area (e.g., 120) of the previously imaged small area (e.g., 22) since at least the image areas, if not the small areas as well, may overlap each other.

Flooding the scanned small area and surrounding image area with positive charge effectively reduces the voltage differential between the small area (e.g., 22) to be imaged and the surrounding image area (e.g., 120 less 22), thus allowing electrons to continue to escape from the imaged small area. The overall charge that builds up on specimen 20 while imaging each small area can be adjusted by changing the ratio between the number of frames in which only the small image area is scanned (zoomed-in-frame) versus the number of frames during which the larger image area is scanned (zoomed-out-frame).

Figure 7:
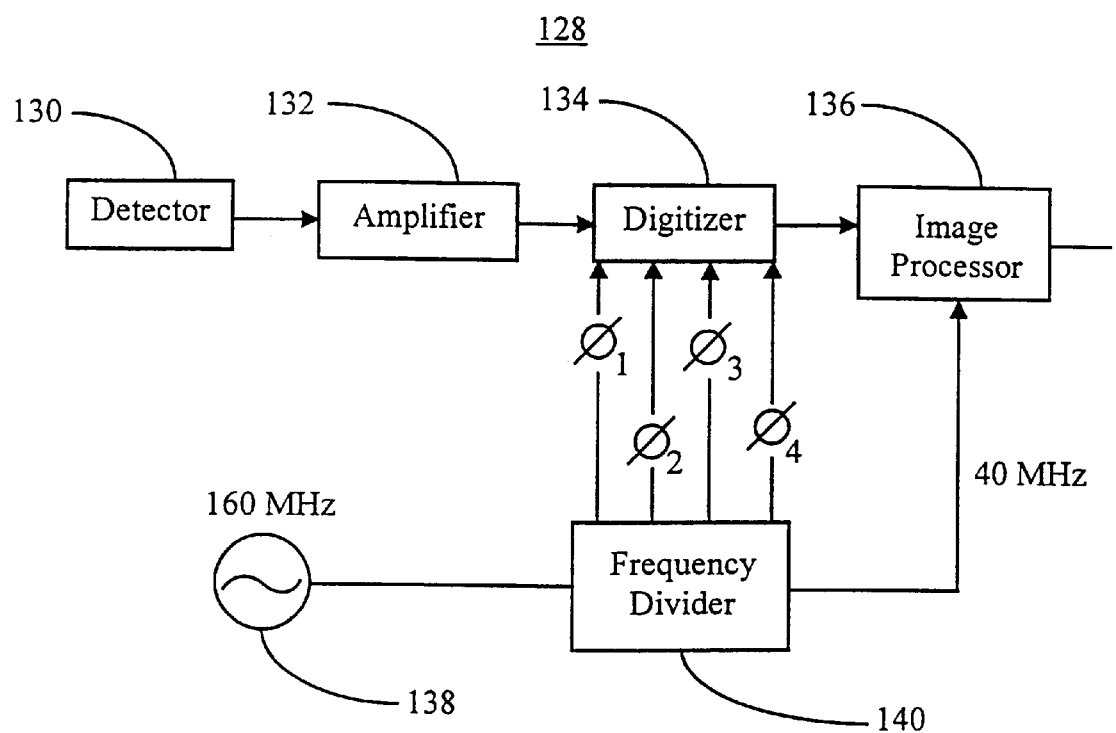
FIG. 7 illustrates an alternative detection and imaging subsystem for multiple scans at incremental offset one from the other.

FIG. 7 provides a sample implementation of an electron detector and image processor subsystem 128 that performs the combined function of electron detector 24 and image processor and display subsystem 26 of FIG. 1. Specifically, subsystem 128 includes a detector 130 that detects the reflected and backscattered electrons from specimen 20 with the output signal from detector 130 applied to amplifier 132. Amplifier 132 subsequently supplies an amplified signal to digitizer 134 where the signal is digitized for application to image processor 136. In the lower path of subsystem 128 there is an oscillator 138 that applies a signal to frequency divider 140 to generate signals to control both digitizer 134 and image processor 136 with the operation of subsystem 128 discussed more completely below. Additionally, comparing the components illustrated in FIG. 7 to those shown in FIG. 2: detector 130 relates to detector 55 and collector plate 56; amplifier 132 relates to amplifier 58; and the remainder of the circuit in FIG. 7 relates to image generator 59.

In the embodiment illustrated in FIG. 7, each y line scan signal in an area of interest on specimen 20 is strobed at four times the conventional video rate (i.e., 160 MHz, the frequency of oscillator 138, corresponds to a four times interleaving using a standard video rate). In the lower path of subsystem 128 a 160 MHz signal is generated by oscillator 138 and applied to frequency divider 140 that performs two functions.

One function of frequency divider 140 is to divide the 160 MHz signal by four to present a 40 MHz signal to image processor 136. The second function of frequency divider 140 is to phase split a 160 MHz signal from oscillator 138 into four 160 MHz strobing signals, each with a different phase relative to each other (i.e., $\phi_1=0°$, $\phi_2=90°$, $\phi_3=180°$ and $\phi_4=270°$). Each of those four different phase strobing signals, $\phi_1$, $\phi_2$, $\phi_3$ and $\phi_4$, are applied to a different terminal of digitizer 134 to cause digitizer 134 to divide each y line scan signal from amplifier 132 into four different y line scan signals.

Given this embodiment, 512 subpixel samples are obtained during each phase shifted strobe, and four consecutive strobes of the same y line scan signal are each strobed with an incremental offset of phase (i.e., a quarter pixel width). These phase shifted y line scan signals are interlaced, resulting in a total of 512 times 4, or 2048 samples per line (e.g., when there are a total of 2048 sample pixels for a y line scan signal, the first strobe with a 0° phase shift strobes pixels 0, 4, 8, etc.; on the next strobe with a 90° phase shift pixels 1, 5, 9 etc. are strobed; on the next scan with a 180° phase shift pixels 2, 6, 10 etc. are strobed; and on the fourth scan with a 270° phase shift pixels 2, 7, 11 etc. are strobed).

The four phase implementation discussed with respect to FIG. 7 represents an economical way of extracting the data from the y line scan signals using less expensive 10 MHz equipment rather than 40 MHz equipment that would be needed without the strobing routine.

Figure 8:
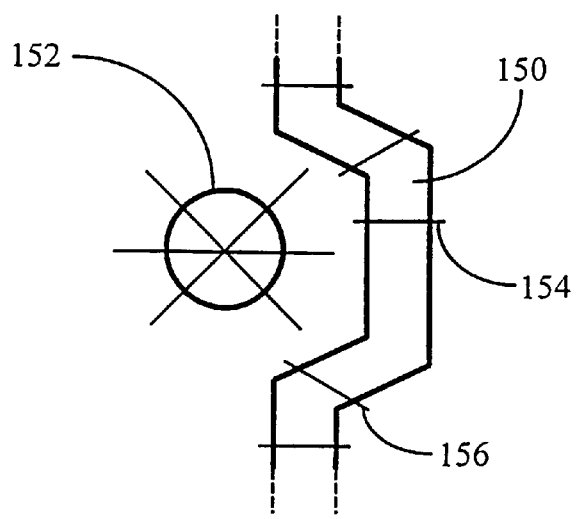
FIG. 8 shows a portion of an image on a specimen to illustrate the capability of multiple feature measurement of the present invention without having to reposition the specimen.

FIG. 8 illustrates one of the aspects of the system of the present invention in which arbitrary programming of the direction of a line scan, and non-sequential line scans, can be used to obtain several critical dimension measurements on a substrate without having to reposition the substrate between each measurement.

Before illustrating that, it would be helpful to introduce the concept of "charge induced asymmetry". Basically when a feature is scanned, such as a line on a wafer, the video signal from the leading edge of that scan provides a different image than the trailing edge of that scan as a result of the scanning process depositing a charge on the wafer during the scanning process thus affecting the resultant video image. That difference in image is referred to as "charge induced asymmetry".

During the development of the present invention it was observed that line scan direction reversal during scanning reduces charge induced asymmetry in the line scan profiles. Therefore, multiple arrays of line scan data may be acquired, wherein the position, length, and orientation of each line scan over the specimen is arbitrarily programmable.

Specifically FIG. 8 shows a portion of a conductive trace 150 dog-legging around a conductive pad 152 on an insulative material. Scan lines 154 and 156 have been added to illustrate two potential locations where multiple, independent measurements may be made sequentially without having to reposition the substrate. Stated in another way, the scanning control system of the present invention can be programmed to deflect the electron beam to separated regions of the portion of the specimen surface beneath the beam deflection window of the electron beam column without moving the specimen. This ability to average over very small areas, and over different orientations, allows for accurate rapid metrology directly off the segment, without repositioning the sample.

Figure 9:
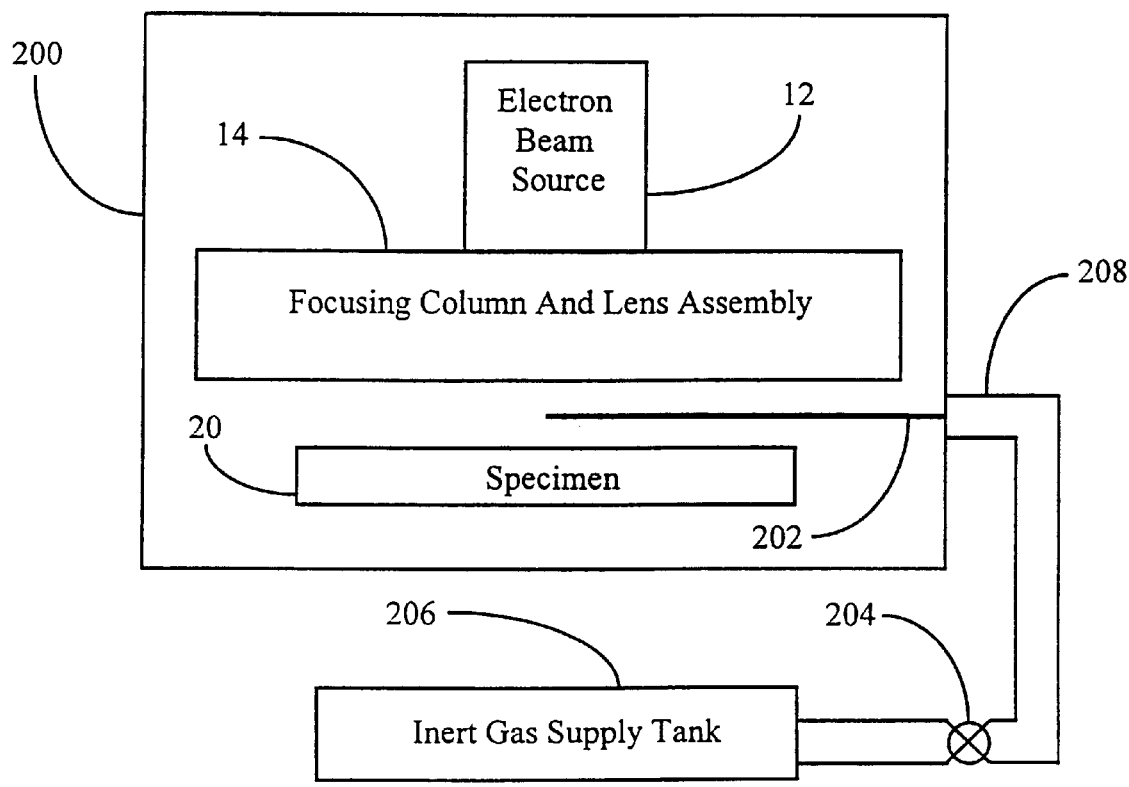
FIG. 9 illustrates a second embodiment of the present invention that minimizes the charge build-up in a specimen when being scanned.

Another embodiment of the present invention to neutralize the charge build-up on a substrate during scanning, and the resultant darkened region is shown in FIG. 9. Enclosed within vacuum chamber 200 are electron beam source 12, focusing column and lens assembly 14 and specimen 20 as in FIG. 2. Additionally, a capillary tube (or capillary array) 202 (such as made by Galileo of Sturbridge, Mass.), made of an electrically conductive material, is inserted into chamber 200 between lens assembly 14 and specimen 20 with an orifice of tube 202 directed at the point where the electron beam impinges on specimen 20. External to vacuum chamber 200 is supply tank 206 to contain an inert gas (e.g., argon) for delivery to capillary tube 202 via the serial connection of leak value 204 (e.g., Varian Model 951-5106) and a gas supply tube 208. The purpose of leak valve 204 is to control the rate at which the inert gas is injected into chamber 200 to maintain the vacuum at the desired level (e.g., $10^{-4}$ Torr). Thus, by injecting the inert gas into chamber 200 at the point at which the electron beam scans specimen 20 the gas ionizes and in so doing neutralizes the charge build-up on specimen 20.

Although the invention has been described in relation to various implementations, together with modifications, variations, and extensions thereof, other implementations, modifications, variations and extensions are within the scope of the invention. Other embodiments may be apparent to those skilled in the art from consideration of the specification and invention disclosed herein. The invention is therefore not limited by the description contained herein or by the drawings, only by the scope of the claims.

What is claimed is:

1. A method for imaging a specimen with a scanning electron microscope, said method comprising the steps of:
   a. raster scanning a first selected small area of said specimen with an electron beam from said electron microscope for a single frame cycle; and
   b. raster scanning a first large area of said specimen that includes said first small area with said electron beam following step a.

2. A method as in claim 1 further comprising the step of:
c. biasing said specimen to a selected potential to create a decelerating field for electrons of said electron beam resulting in a lowered landing energy.

3. A method as in claim 1 wherein step b. brightens the image of said first small area of said specimen by flooding said first large area with electrons.

4. A method as in claim 1 wherein step b. is repeated a plurality of times one after the other.

5. A method as in claim 4 wherein the repetition of step b. multiple times brightens the image of said first small area relative to a cumulative image of said first large area.

6. A method as in claim 1 wherein said first large area surrounds said first small area.

7. A method as in claim 6 wherein said first small area is flooded with electrons.

8. A method as in claim 1 further including the steps of:
c. raster scanning a second selected small area of said specimen with said electron beam for a single frame cycle following step b.; and
d. raster scanning a second large area of said specimen that includes said second small area with said electron beam following step c.

9. A method as in claim 8 wherein steps b. and d. are each repeated a plurality of times one after the other.

10. A method as in claim 8 wherein said first large area surrounds said first small area, and said second large area surrounds said second small area.

11. A method as in claim 8 wherein said first and second small areas at least partially overlap each other.

12. A method as in claim 8 wherein said first and second large areas at least partially overlap each other.

13. A method as in claim 8 wherein a line period of each raster scan of each of said first and second small areas of steps a. and c. is substantially shorter than typical video scan rates of scanning electron microscopes.

14. A method as in claim 1 wherein a line period of each raster scan of said first small area of step a. is substantially shorter than typical video scan rates of scanning electron microscopes.

15. A method as in claim 14 wherein the peak scanning current is reduced.

16. A method as in claim 1 wherein step a. is performed by scanning said electron beam across first small area starting at a selected first x axis coordinate and ending at a second x axis coordinate for each of a selected number of y axis coordinates with said electron beam otherwise blanked.

17. A method as in claim 1 wherein step a. is performed by scanning said electron beam across said first small area starting at a selected first x axis coordinate, proceeding to a second x axis coordinate and returning to said selected first x axis coordinate for each of a set number of y axis coordinates with said electron beam otherwise blanked.

18. A method as in claim 1 further including the step of:
e. strobing each y axis scan signal of steps a. and b. at a selected multiple of the video scan rate to convert each said y axis scan signal into selected multiple y axis scan signals with an equal phase shift between each of said selected multiple y axis scan signals being determined by the multiple selected.

19. A method as in claim 18 wherein said selected multiple in step e. is four resulting in said selected multiple y axis scan signals being four in number each with a phase shift of 90° between each subsequent one of said four selected multiple y axis scan signals.

20. A method for imaging a specimen with a scanning electron microscope, said method comprising the steps of:
a. raster scanning a selected small area of said specimen with an electron beam from said electron microscope for a single frame cycle;
b. injecting an inert gas at a point above said specimen where said electron beam impinges on said specimen to neutralize a charge build-up on said specimen by the ionizaton of said inert gas by said election beam; and
c. biasing said specimen to a selected potential to create a decelerating field for electrons of said electron beam resulting in a lowered landing energy.

21. A method as in claim 20 wherein said inert gas is argon.

* * * * *